United States Patent [19]
Hughes et al.

[11] Patent Number: 5,349,245
[45] Date of Patent: Sep. 20, 1994

[54] SIGNAL PROCESSING ARRANGEMENTS

[75] Inventors: John B. Hughes, Hove; Kenneth W. Moulding, Horley, both of England

[73] Assignee: U.S. Philips Corporation, New York, N.Y.

[21] Appl. No.: 24,597

[22] Filed: Mar. 1, 1993

[30] Foreign Application Priority Data

Mar. 5, 1992 [GB] United Kingdom ............ 9204763.8

[51] Int. Cl.$^5$ ..................... G11C 27/02; G06G 7/12
[52] U.S. Cl. ............................. 307/353; 307/246; 307/491
[58] Field of Search ............ 307/352, 353, 490, 491, 307/240, 246, 572; 328/127

[56] References Cited

U.S. PATENT DOCUMENTS

| | | | |
|---|---|---|---|
| 4,866,368 | 9/1989 | Bird | 307/353 |
| 5,109,169 | 4/1992 | Hughes | 307/353 |
| 5,179,301 | 1/1993 | Hughes | 307/353 |
| 5,296,752 | 3/1994 | Groeneveld et al. | 307/353 |

OTHER PUBLICATIONS

"Analysis and Improvements of Accurate Dynamic Current Mirrors", IEEE Journal of Solid State Circuits, vol. 25, No. 3, Jun. 1990, pp. 699–706.

*Primary Examiner*—Timothy P. Callahan
*Assistant Examiner*—Toan Tran
*Attorney, Agent, or Firm*—Bernard Franzblau

[57] ABSTRACT

Switched current circuits include current memory cells which store analogue currents by way of the charge on the gate source capacitance of an MOS transistor. A source of inaccuracy in these circuits is switch charge injection into the gate source capacitance. It has been found that the error current produced by a single current memory cell is relatively flat over a current range centered above a peak value of stored current. When two current memory cells are connected in cascade this error may be cancelled. In order to produce equal errors an optimum bias current is generated which depends on parameters variable in integrated circuit manufacturing processes but which are relatively constant within an individual integrated circuit. The two cascaded current memory cells include controllable bias current sources and a control circuit controls the current sources so that the current memory cells operate at the optimum bias current. The control circuit includes two further current memory cells connected in cascade and two different value current sources are provide. The error current due to switch charge injection charges a capacitor (Cx). The voltage across this capacitor controls current sources (T16,T17) and also current sources (T14,T15). The current sources (T14,T15) and capacitor form a control feedback loop that causes the bias current to approximate the optimum value.

6 Claims, 4 Drawing Sheets

SIGNAL PROCESSING ARRANGEMENTS

BACKGROUND OF THE INVENTION

This invention relates to a circuit arrangement for processing electrical signals in the form of sampled analogue currents, the circuit arrangement comprising a first current memory cell having a current input for receiving an input analogue current and a current output for producing a stored analogue current and comprising a first field effect transistor having its drain and gate electrodes coupled via a first switch which is controlled by means of a clock signal such that it is closed during a first portion of a clock period, means for coupling the current input to the drain electrode of the first transistor during the first portion of the clock period, means for coupling the current output to the drain electrode of the first transistor during a second portion of the clock period, and means for feeding a first bias current to the drain electrode of the first transistor, a second current memory cell connected in cascade with said first current memory cell, said second current memory cell having a current input for receiving an input analogue current and a current output for producing a stored analogue current and comprising a second field effect transistor having its drain and gate electrodes coupled via a first switch which is controlled by means of a clock signal such that it is closed during a second portion of the clock period, means for coupling the current input to the drain electrode of the second transistor during the second portion of the clock period, means for coupling the current output to the drain electrode of the transistor during the first portion of the clock period, and means for feeding a second bias current to the drain electrode of the transistor.

A class of analogue signal processing arrangements which manipulates units of currents has become known as switched current circuits. These arrangements are constructed from current amplifying and summing circuits and current memory circuits. The current memory circuits or cells may comprise in their simplest form a field effect transistor having a switch connected between its gate and drain electrodes. An input current is fed to the drain electrode when the switch is closed and causes the gate-source capacitance to be charged. When the switch is opened the voltage at the gate electrode is maintained by the charge on the gate-source capacitance and this causes the transistor to reproduce the same current as was fed to it when the switch was closed. Normally two further switches are provided, one closed in synchronism with the first switch to apply an input current to the transistor and the other closed during a second period to provide a means for deriving an output current, the output current being a replica of the input current and being produced during a later portion of the clock period or during a portion of a later clock period. Thus the current memory cell can act as an analogue signal delay circuit with a unit delay of half a clock period being easily realisable.

This basic current memory cell has certain limitations in its analogue performance due to non-ideal MOS transistor performance, in particular non-zero output conductance, finite bandwidth, and switch charge injection.

The reduction of switch charge injection in dynamic current mirrors which use a cell having the same form as used in switched current circuits as the current memory cell is proposed in a paper by G. Wegmann and E. A. Vittoz entitled "Analysis and Improvements of Accurate Dynamic Current Mirrors" published in IEEE Journal of Solid State Circuits, Vol. 25, No. 3, June 1990, pages 699–706. The authors adopt two measures, the provision of symmetrical dummy switches and the control of the amplitude of the clock signal controlling the switches to cause it to adopt the minimum level required to switch the current applied to the cell. Both of these measures will reduce the magnitude of the error current produced as a result of charge injection when the switches are operated by reducing the magnitude of the charge injection.

SUMMARY OF THE INVENTION

The present invention has as its primary objective the reduction of the effect of switch charge injection on the performance of signal processing arrangements for processing electrical signals in the form of sampled analogue currents.

The invention provides a circuit arrangement for processing electrical signals in the form of sampled analogue currents, the circuit arrangement being as set forth in the opening paragraph and being characterised by means for causing the magnitudes of the bias currents to be such that errors due to charge injection in the first current memory cell are substantially cancelled by oppositely signed errors in the second current memory cell.

The invention is based on the discovery that error currents caused by charge injection in current memory cells increase with an increasing input current up to a certain value and then start to decrease and that there is an area around the maximum which is relatively constant and that the error current reduction on each side of the maximum is relatively symmetrical. Since the basic current memory cell produces an inverted output, that is an input current flowing into the current memory cell will produce an output current flowing into the current memory cell, when two current memory cells are connected in cascade the error currents will tend to cancel. If the bias current is then chosen so that it is at the value which produces the maximum error current caused by charge injection then the error currents caused by input signal currents will substantially cancel over two cascaded current memory cells since one cell will store a current $J+i$ and the other a current $J-i$, where i is the input current and J the bias current. Thus the error currents $\delta I_1 = \delta(J+i)$ and $\delta I_2 = \delta(J-i)$ produced by the first and second current memory cells will be substantially equal and thus cancel leaving a much smaller error current $\delta I$ at the output of the two cascaded stages. Consequently although the actual error currents produced by each current memory cell due to charge injection effects are chosen to be at a relatively high value the overall error current produced by a cascaded pair of current memory cells is minimised. Current memory cells are often used in pairs in current signal processing circuit modules such as integrators, differentiators, unit delay cells for FIR filters, etc. Thus, by reducing the error current produced by charge injection over a pair of cascaded current memory cells an improvement in the analogue signal performance of the modules can be achieved.

In a first embodiment, the circuit arrangement may comprise a control circuit for adjusting the bias current magnitude in the first and second current memory cells, the control circuit comprising third and fourth current memory cells connected in cascade, the third and fourth current memory cells each comprising a bias current source, the bias current sources in the third and fourth current memory cells producing mutually different bias currents, means for detecting an output current produced at the output of the fourth current memory cell and deriving therefrom a control signal to control two further current sources, one for each of the third and fourth current memory cells and each producing substantially the same current, such that the error current tends to a minimum value, and means for applying the control signal to the first and second current memory cells to adjust the magnitude of the bias current produced in the first and second current memory cells.

By using third and fourth current memory cells which are similar in form to the first and second current memory cells and biassing them with different magnitude bias currents an output error current is produced. This can then be applied to a control circuit which controls a further current source in each of the current memory cells. The control circuit output forces the further current source in each current memory to produce a current which causes the total bias currents applied to the third and fourth current memory cells to be on either side of the value at which maximum error current occurs within a single cell. The output error current from the fourth current memory cell thus tends to zero causing the control signal to stabilise at the value which produces minimum total error over the two stages. The control signal can then be used to control the bias currents produced in all pairs of cascoded current memory cells within the signal processing arrangement. Thus process related differences in parameters between different integrated circuits are taken up by adjusting the bias currents produced, it being assumed that differences within a chip are relatively small and thus only one control arrangement is required. It would, of course, be possible to bias different groups of memory cells within one integrated circuit using separate control arrangements if this was deemed necessary to meet given performance requirements.

The control signal may be derived by charging a capacitor by the output current of the fourth current memory cell and using the voltage across the capacitor to control the currents produced by the two further current sources.

This provides a control voltage which may be used to control the current produced by a field effect transistor acting as the bias current source by controlling its gate potential.

In an alternative embodiment the circuit arrangement may comprise control means for controlling the amplitude of the clock signal to cause the magnitude of the bias current to be such that errors due to charge injection in one current memory cell are substantially cancelled by oppositely signed errors in the second current memory.

It has further been found that the current at which maximum error current due to charge injection is produced is dependent on the amplitude of the clock signal which controls the operation of the switches. In the alternative embodiment this property is used to reduce the overall error current by adjusting the clock signal amplitude to reduce the total error current produced over the cascade arrangement of two current memory cells. This enables fixed value current sources to be used in the current memory cells.

The control means may comprise third and fourth current memory cells connected in cascade, the third and fourth current memory cells being of the same form as the first and second current memory cells and each including a bias current source, the bias current sources in the third and fourth current memory cells producing mutually different currents, means for deriving a control signal from the output current of the fourth current memory cell, means for applying the control signal to a clock signal generator to control the amplitude of the clock signals produced, and means for applying the clock signals to the switches to control their operation, the control signal being such that the controlled amplitude of the clock signals cause substantially equal charge injection induced error currents to be produced in the first and second current memory cells.

Thus the provision of an extra pair of current memory cells whose error current will be affected by process parameters to approximately the same extent as those forming the signal processing part of the circuit arrangement enables the error currents to be monitored and used to control the clock signal amplitude in a manner such that the overall error current from a cascaded pair of current memory cells is minimised.

BRIEF DESCRIPTION OF THE DRAWINGS

The above and other features and advantages of the invention will be apparent from the following description, by way of example, of embodiments of the invention with reference to the accompanying drawings, in which.

DESCRIPTION OF THE PREFERRED EMBODIMENTS

Figure 1A:
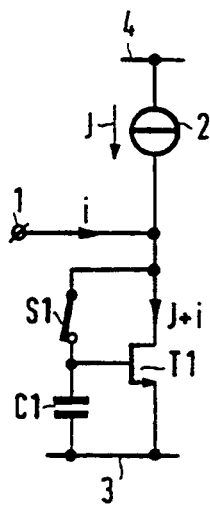
FIGS. 1a) to f) illustrates the operation of known current memory cells connected in cascade.
Figure 1B:
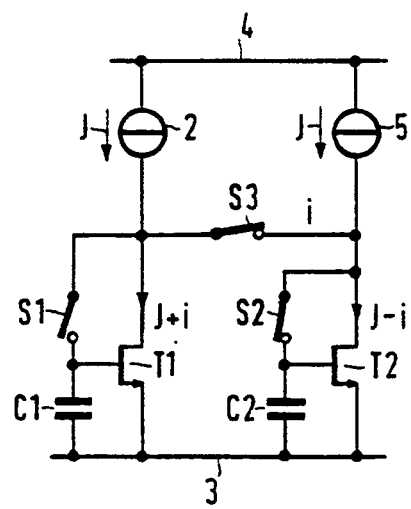
Figure 1C:
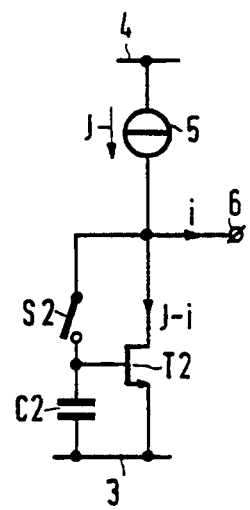

FIGS. 1a–1c illustrate the ideal transmission of a sample current through two cascaded current memory cells. FIG. 1a shows the first current memory cell when sampling an input current i, FIG. 1b shows the first current memory cell connected in cascade with the second current memory cell when an output current −i from the first current memory cell is being transferred to the input of the second current memory cell, and FIG. 1c shows the second current memory cell when storing the current sensed at its input or outputting the stored current i.

The first current memory cell comprises an input 1 which receives the input current i and which is coupled to the junction of a current source 2 and the drain electrode of an n-channel field effect transistor T1. A switch S1 is connected between the drain and gate electrodes of transistor T1. The source electrode of transistor T1 is connected to a negative supply rail 3 while the other end of the current source 2 is connected to a positive supply rail 4. A capacitor C1 is connected between the gate electrode of transistor T1 and the negative supply rail 3. The capacitor C1 may be the intrinsic gate source capacitance of transistor T1. The second current memory cell comprises an n-channel field effect transistor T2 having a switch S2 connected between its drain and gate electrodes and its drain electrode connected via a current source 5 to the positive supply rail 4. The source electrode of transistor T2 is connected to the negative supply rail 3 while a capacitor C2 is connected between its gate electrode and the negative supply rail 3. Again the capacitor C2 may be formed by the intrinsic gate source capacitance of transistor T2. A further switch S3 couples the drain electrodes of transistors T1 and T2. The drain electrode of transistor T2 is connected to an output 6 from which an output current i may be derived. In practice further switches may be connected between the input 1 and the junction of transistor T1 and current source 2 and between the output 6 and the junction of transistor T2 and the current source 5. The current sources 2 and 5 are arranged to produce equal currents J which enable a bidirectional input current to be handled. The input currents should have a magnitude of less than J so that the diode connected transistors T1 and T2 do not become reverse biassed.

To sample an input current i the switch S1 is closed and switch S3 is open during a portion $\emptyset 1$ of each cycle of a clock signal. Transistor T1 is consequently connected as a diode and will pass the current J+i. At the same time the capacitor C1 will be charged through the switch S1 to store a charge which is dependent on the gate source voltage of the transistor T1. When, at the end of the portion $\emptyset 1$ the switch S1 is opened, the charge remains on capacitor C1 and hence causes the transistor T1 to draw the same current J+i. Switches S2 and S3 are then closed during a portion $\emptyset 2$ of the clock signal. The current J+i in transistor T1 is then derived from the current sources 2 and 5 resulting in a current J−i being passed through transistor T2 which is now diode connected. Similarly the capacitor C2 becomes charged to the gate source potential of transistor T2 and when at the end of the portion $\emptyset 2$ switches S2 and S3 are opened the current through transistor T2 is maintained at the value J−i. As a result a current of +i is available at output 6 while switches S2 and S3 are open. Thus the current at output 6 is equal to the current applied to input 1 but is delayed in time depending on the sequential operation of the switches S1 to S3. In a typical application the switch S1 would be closed during a first portion of a clock period while switches S2 and S3 are closed during a second portion of the clock period. Thus the current i produced at output 6 is equal to the current i applied to input 1 in the previous clock cycle.

Figure 1D:
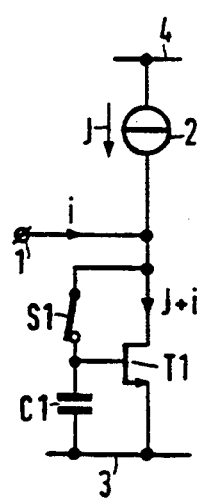
Figure 1E:
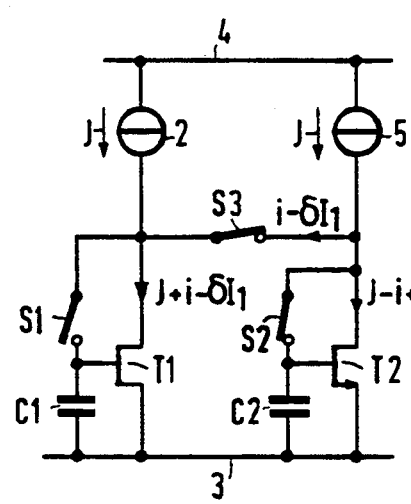
Figure 1F:
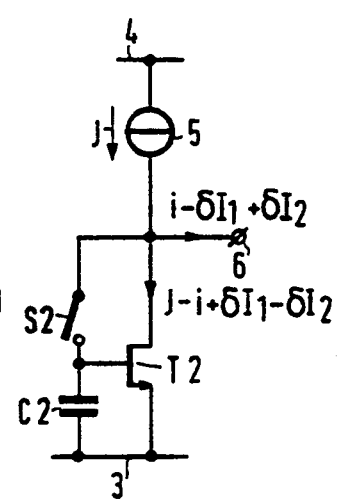

FIGS. 1d–f illustrates the action of the cascaded memory cells in the same way but includes the effect of error currents produced by charge injection caused by the operation of switches S1 and S2. During the first portion $\emptyset 1$ of a clock cycle switch S1 is closed and the current i is fed to the diode connected transistor T1 and, as a result, when switch S1 opens a current J+i should be stored. However, as switch S1 opens there is a transfer of charge between its capacitance and that of capacitor C1. This results in an error current of $-\delta I_1$ being produced in transistor T1. Thus the current stored in transistor T1 when switch S1 opens becomes $J+i-\delta I_1$. When, during a second portion of the clock period, switches S2 and S3 close the current $J+i-\delta I_1$ is derived from the two current sources 2 and 5. As a result a current $J-i+\delta I_1$ is fed to the diode connected transistor T2. In a similar manner when switch S2 opens charge injection causes an error current $\delta I_2$ to be passed through the transistor T2 and thus the total current stored in transistor T2 is $j-i+\delta I_1-\delta I_2$ which gives a resultant output current of $i-\delta I_1+\delta I_2$. Clearly if $\delta I_1$ can be made equal to $\delta I_2$ then the effect of charge injection in switches S1 and S2 will be eliminated. By correctly choosing the value of J, the bias current, this situation can be approximated to.

Figure 2:
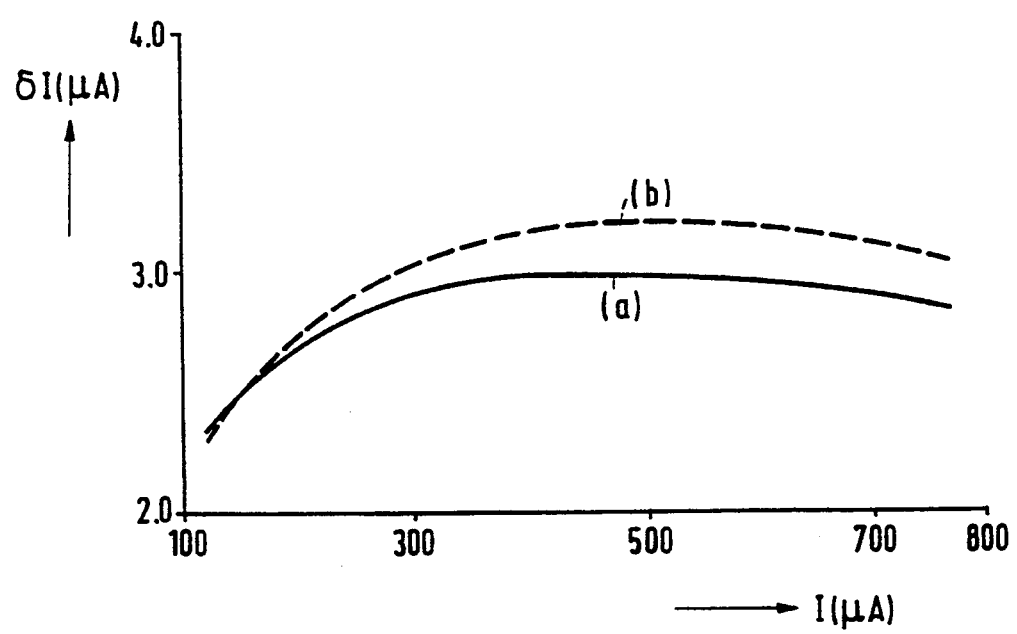
FIG. 2 shows the variation of error current due to charge injection with total stored current in a single current memory cell.

FIG. 2 shows a typical example of the characteristic of current against error current for a current memory cell as shown in FIG. 1a. Curve a) is the result of plotting a simulated error current from a computer simulation of the circuit, whereas curve b) shows the error current which is calculated from an approximate mathematical representation of the device characteristics. As can be seen from FIG. 2 there is a region of comparatively constant error around an optimum position. The optimum position is not sharp so that this error current may be reasonably constant around the optimum position. In addition, as the error falls off on either side of the optimum a wider signal current swing will again reach positions on the curve where the error current is approximately equal for equal current swings about the bias current. A possible explanation for the shape of the curve is as follows. At low currents the clock voltage at which the switch opens is also low resulting in a high injected charge. However, the transconductance of the cell is low and this gives a low error current. At high currents the clock voltage at which the switch opens is higher and the injected charge is lower. Even though the transconductance of the cell is higher this gives a lower output error. Maximum occurs when the effect of decreasing injected charge just cancels the effect of increasing transconductance.

The optimum bias current varies with process dependent parameters and in order to automatically obtain the optimum bias current a control circuit is needed to derive the bias current. Within an integrated circuit the process parameters will be substantially constant and thus the same bias current can be generated for each of the current memory cells and only a single control circuit is necessary to control the generation of the bias currents.

Figure 3A:
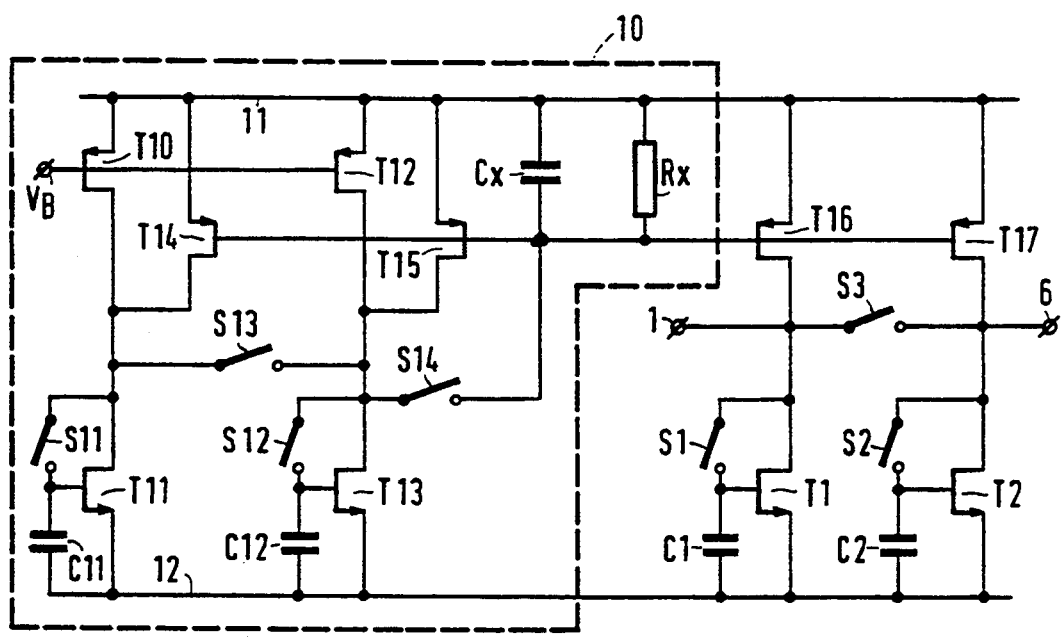
FIGS. 3a–3b show a first embodiment of a circuit arrangement according to the invention.

The circuit arrangement shown in FIG. 3 includes a first control arrangement 10 for producing the optimum bias current for the current memory cells. The control arrangement shown in FIG. 3 is basically two current memory cells connected in cascade but to which only bias currents are applied. In FIG. 3 a first p-channel field effect transistor T10 is connected in series with a first n-channel field effect transistor T11 between a positive supply rail 11 and a negative supply rail 12. A first switch S11 is connected between the drain electrode of transistor T11 and its gate electrode while a capacitor C11 is connected between the gate electrode of transistor T11 and the supply rail 12. The junction of the drain electrodes of transistors T10 and T11 are connected via a switch S13 to the junction of the drain electrodes of a p-channel field effect transistor T12 and an n-channel field effect transistor T13. The source electrode of transistor T12 is connected to the positive supply rail 11 while the source electrode of transistor T13 is connected to the negative supply rail 12. A switch S12 is connected between the drain and gate electrodes of transistor T13 while a capacitor C12 is connected between its gate and source electrodes. The gate electrodes of transistors T10 and T12 are connected to a bias potential $V_B$. The components mentioned thus far form two cascaded memory cells, the transistors T10 and T12 being connected as current sources. Two further p-channel field effect transistors T14 and T15 have their source electrodes connected to the positive supply rail 11. The drain electrode of transistor T14 is connected to the drain electrode of transistor T11 while the drain electrode of T15 is connected to the drain electrode of transistor T13. The drain electrode of transistor T13 is connected through a switch S14 to one end of a capacitor Cx whose other end is connected to the positive supply rail 11. A resistor Rx is connected in parallel with the capacitor Cx and the gate electrodes of transistors T14 and T15 are connected to the junction of the switch S14 and the capacitor Cx. This junction is further connected to the gate electrodes of two p channel field effect transistors T16 and T17 which are equivalent to the current sources 2 and 5 of the cascaded current memory cells shown in FIG. 1. The reference labels for the rest of the cascaded current memory cells are the same as those shown in FIG. 1.

Figure 3B:
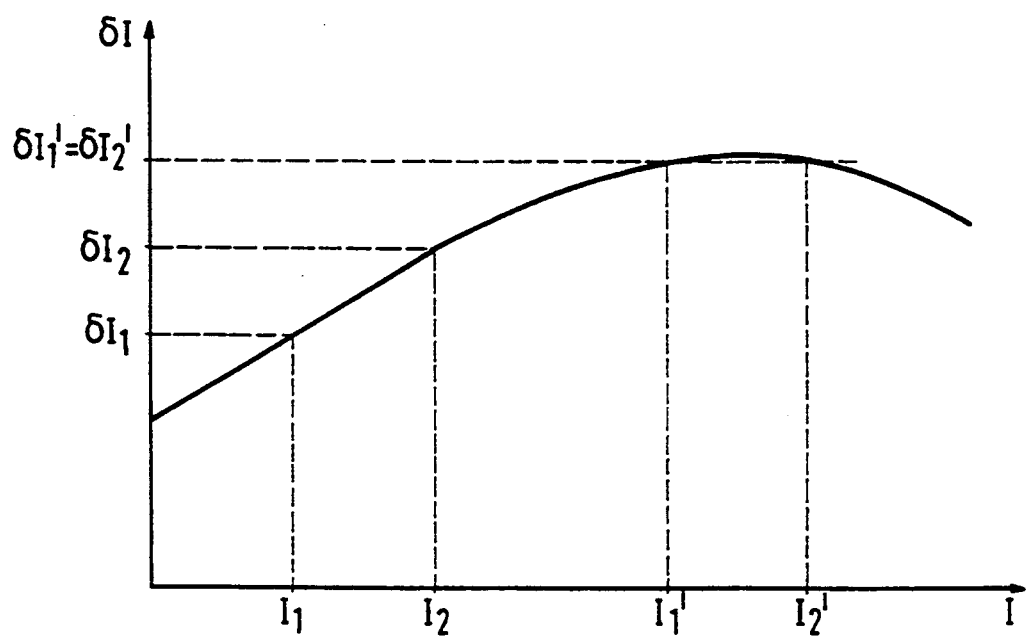

Initially capacitor Cx, which is chosen to have a large enough value so that charge injection into it has negligible effect, is discharged by a large resistor Rx and the cells are biassed by the currents in transistors T10 and T12 which are dimensioned such that the current $I_1$ produced by transistor T10 is smaller than the current $I_2$ produced by the transistor T12. The charge injection errors generate a current $\delta I_2 - \delta I_1$ which flows into capacitor Cx on each clock phase $\emptyset 1$ of the clock which operates the switches S11 to S14. As Cx is charged transistors T14 and T15 supply additional equal bias currents to the memory cells. The currents supplied continue to increase as Cx continues to charge until the maximum of the $\delta I/I$ characteristic is reached as shown in FIG. 3b. At this point $\delta I_2$, produced by current $I_2'$, is equal to $\delta I_1$, produced by current $I'_1$, and no current is available to charge capacitor Cx any further. The bias currents of the control circuit 10 stabilise at this value as do the bias currents supplied to other cells on the same chip. Clearly, the current through transistor T14 (and T15) will be equal to $J - I_1$, where J is the optimum bias current. Consequently the dimensions of transistors T14 and T15 will have to be scaled appropriately with respect to the bias current generation transistors, such as T16 and T17, in the signal processing current memory cells which will not include equivalent sources to those provided by transistors T10 and T12 in the control circuit 10.

It has further been discovered that the optimum bias current is affected by the clock signal amplitude and consequently, instead of varying the bias current, it is possible to vary the clock signal amplitude to cause the bias current to be optimum.

Figure 4A:
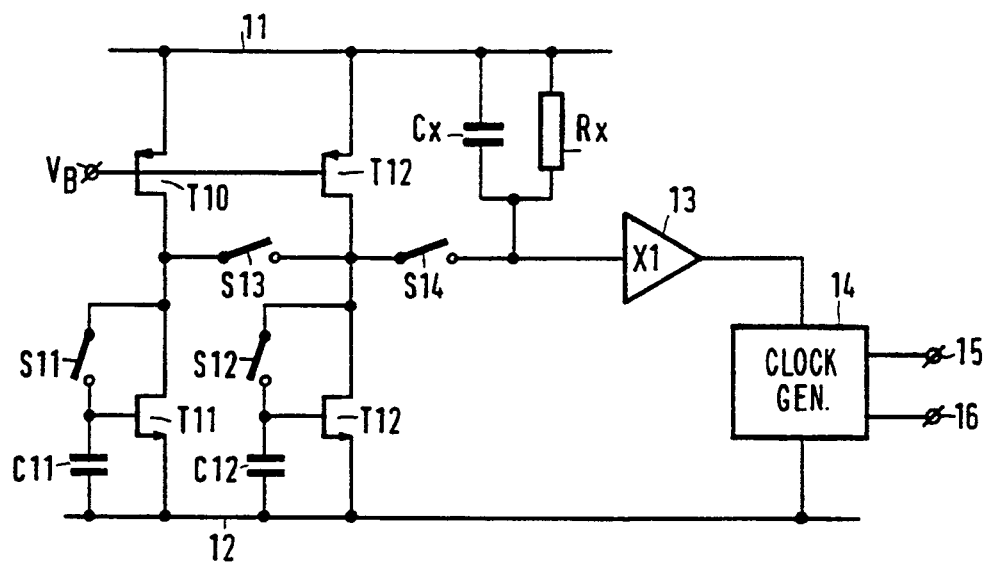
FIGS. 4a–4b show a second embodiment of a circuit arrangement according to the invention.
Figure 4B:
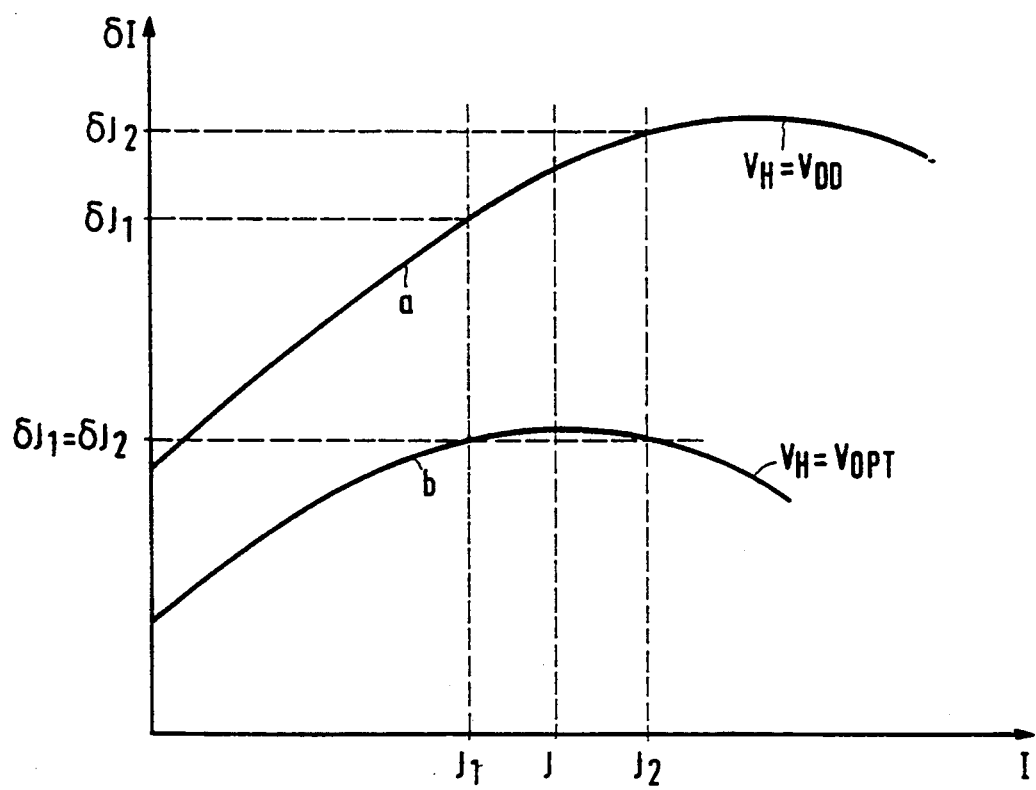

FIG. 4 shows a second control arrangement which in this case varies the clock signal amplitude to cause the error characteristic to become symmetrical about the bias current within the current memory cells. In FIG. 4 those components having the same function as those in FIG. 3 have been given the same reference labels. The arrangement shown in FIG. 4 contains two current memory cells which are similar to those in FIG. 3 and whose output is fed via the switch S14 to the parallel combination of capacitor Cx and resistor Rx. However, the bias current sources formed by transistors T10 and T12 are now arranged to produce bias currents J1 and J2 which are set symmetrically about the bias current J used by the current memory cells in the signal processing part of the circuitry. The additional components in the arrangement shown in FIGS. 4 are an amplifier 13 which produces a voltage $V_{DD}$ for the clock generator 14. The clock generator produces two clock signals $\emptyset 1$ and $\emptyset 2$ of the same frequency. The switches S11 and S14 are closed during phase $\emptyset 1$ while the switches S12 and S13 are closed during the phase $\emptyset 2$. The clock voltage $V_H$ will start initially as being equal to $V_{DD}$ the voltage on the positive supply rail 11, when capacitor Cx is completely discharged and the error characteristic will be as shown as curve a) in FIG. 4b. As can be seen the currents J1 and J2 cause error currents $\delta J_1$ and $\delta J_2$ which are different. The difference current will cause capacitor Cx to start to charge. This process continues and causes the voltage $V_H$ to decrease until the curve approaches curve b) of FIG. 4b where $\delta J_2$ is equal to $\delta J_1$. This clock signal is fed to all of the other current memory cells in the signal processing circuitry. The bias current J will therefore be set at the optimum bias current as far as charge injection error reduction is concerned since the clock signal amplitude is adjusted to make this so.

The present invention uses the principle of cancelling charge injection errors over two cascaded current memory cells and thus enables a current memory cell having a larger charge injection error to be used while still giving reasonable performance. There is of course no reason why this technique should not be combined with other techniques for reducing charge injection error in individual current memory cells, though clearly only some charge injection reduction techniques are compatible. For example, the use of dummy switches would be entirely compatible with the present invention, but it would not be possible to use the second technique described by Wegman and Vittoz of tailoring the clock signal voltage to the amplitude of the signal currents in the current memory cells according to this invention, the clock voltage is set to a value which gives the equal and opposite errors in succesive cascaded stages.

The invention has been described using a basic current memory cell of the simplest kind. It is equally applicable to other current memory cells which have circuit enhancements to reduce other inaccuracies within the current memory cell. Thus, enhancements to produce a more nearly zero output conductance, for example, the use of cascode connected transistors could additionally be employed. Further, although the memory transistors shown have been n-channel field effect transistors it is of course equally usable with p-channel field effect transistors as the memory devices, the polarities of the supplies merely being reversed and n-channel devices used as the current sources.

From reading the present disclosure, other modifications will be apparent to persons skilled in the art. Such modifications may involve other features which are already known in the design, manufacture and use of electrical or electronic circuits and component parts thereof and which may be used instead of or in addition to features already described herein. Although claims have been formulated in this application to particular combinations of features, it should be understood that the scope of the disclosure of the present application also includes any novel feature or any novel combination of features disclosed herein either explicitly or implicitly or any generalisation thereof, whether or not it relates to the same invention as presently claimed in any claim and whether or not it mitigates any or all of the same technical problems as does the present invention.

We claim:

1. A circuit arrangement for processing electrical signals in the form of sampled analogue currents, the circuit arrangement comprising: a first current memory cell having a current input for receiving an input analogue current and a current output for producing a stored analogue current and comprising a first field effect transistor having its drain and gate electrodes coupled via a first switch which is controlled by means of a clock signal such that it is closed during a first portion of a clock period, means for coupling the current input to the drain electrode of the first transistor during the first portion of the clock period, means for coupling the current output to the drain electrode of the first transistor during a second portion of the clock period, and means for feeding a first bias current to the drain electrode of the first transistor, a second current memory cell connected in cascade with said first current memory cell, said second current memory cell having a current input for receiving an input analogue current and a current output for producing a stored analogue current and comprising a second field effect transistor having its drain and gate electrodes coupled via a first switch which is controlled by means of a clock signal such that it is closed during a second portion of the clock period, means for coupling the current input to the drain electrode of the second transistor during the second portion of the clock period, means for coupling the current output to the drain electrode of the second transistor during the first portion of the clock period, and means for feeding a second bias current to the drain electrode of the second transistor, and means for causing the magnitude of the first and second bias currents to be such that errors due to charge injection in the first current memory cell are substantially cancelled by oppositely signed errors in the second current memory cell.

2. A circuit arrangement as claimed in claim 1 wherein the causing means comprises a control circuit for adjusting the bias current magnitude in the first and second current memory cells, the control circuit comprising third and fourth current memory cells connected in cascade, the third and fourth current memory cells each comprising a bias current source, the bias current sources in the third and fourth current memory cells producing mutually different bias currents, means for detecting an output current produced at the output of the fourth current memory cell and deriving therefrom a control signal to control first and second further current sources coupled to the third and fourth current memory cells, respectively, the further current sources producing substantially the same current, and means for applying the control signal to the first and second current memory cells to adjust the magnitude of the respective bias currents produced in the first and second current memory cells.

3. A circuit arrangement as claimed in claim 2 wherein the detecting means includes a capacitor and the control signal is derived by charging the capacitor by the output current of the fourth current memory cell and using the voltage across the capacitor to control the currents produced by the first and second further current sources 4. A circuit arrangement as claimed in claim 1 wherein the causing means comprises control means for controlling the amplitude of the clock signal to cause the magnitude of the bias current to be such that errors due to charge injection in the first current memory cell are substantially cancelled by oppositely signed errors in the second current memory cell.

5. A circuit arrangement as claimed in claim 4 in which the control means comprises third and fourth current memory cells connected in cascade, the third and fourth current memory cells being of the same form as the first and second current memory cells and each including a bias current source, the bias current sources in the third and fourth current memory cells producing mutually different currents, means for deriving a control signal from the output current of the fourth current memory cell, means for applying the control signal to a clock signal generator to control the amplitude of the clock signals produced, and means for applying the clock signals to the switches to control their operation, the control signal being such that the controlled amplitude of the clock signals cause substantially equal charge injection induced error currents to be produced in the first and second current memory cells.

6. A circuit arrangement as claimed in claim 5 wherein the control signal deriving means comprises a capacitor which is charged by the output current of the fourth memory cell, the control signal being the voltage across the capacitor.

* * * * *